(12) United States Patent
Skalski

(10) Patent No.: US 12,238,907 B2
(45) Date of Patent: Feb. 25, 2025

(54) POWER MODULE ASSEMBLY FOR A VEHICLE POWER INVERTER

(71) Applicant: FORD GLOBAL TECHNOLOGIES, LLC, Dearborn, MI (US)

(72) Inventor: Vincent T. Skalski, Plymouth, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 208 days.

(21) Appl. No.: 18/187,923

(22) Filed: Mar. 22, 2023

(65) Prior Publication Data

US 2024/0324151 A1 Sep. 26, 2024

(51) Int. Cl.
| | |
|---|---|
| *H05K 7/20* | (2006.01) |
| *B60L 53/22* | (2019.01) |
| *H05K 7/14* | (2006.01) |

(52) U.S. Cl.
CPC .......... *H05K 7/20927* (2013.01); *B60L 53/22* (2019.02); *H05K 7/1417* (2013.01); *B60L 2210/40* (2013.01)

(58) Field of Classification Search
CPC .. H05K 7/20927; H05K 7/1417; B60L 53/22; B60L 2210/40
See application file for complete search history.

(56) References Cited

U.S. PATENT DOCUMENTS

| | | | |
|---|---|---|---|
| 9,781,867 B2 * | 10/2017 | Yonak | B60K 6/543 |
| 10,314,207 B1 | 6/2019 | Skalski et al. | |
| 10,707,771 B1 | 7/2020 | Chen et al. | |
| 2017/0094836 A1 * | 3/2017 | Lo | H05K 7/20927 |
| 2023/0371200 A1 * | 11/2023 | Lee | H05K 7/20272 |

* cited by examiner

*Primary Examiner* — Mukundbhai G Patel
(74) *Attorney, Agent, or Firm* — David B Kelley; Brooks Kushman P. C

(57) ABSTRACT

A power module assembly for a power inverter of a vehicle includes a housing defining a cavity and a plurality of cards arranged side-by-side in a planar, linear array. The array is positioned within the cavity such that an inlet manifold is defined between a first longitudinal side of the array and the housing and an outlet manifold is defined between a second longitudinal side of the array and the housing. The inlet and outlet manifolds cooperate to form a fluid circuit that is in direct contact with both sides of each of the cards.

20 Claims, 7 Drawing Sheets

POWER MODULE ASSEMBLY FOR A VEHICLE POWER INVERTER

TECHNICAL FIELD

The present disclosure relates to power module assemblies for power inverters of motor vehicles.

BACKGROUND

Vehicles such as battery-electric vehicles (BEVs), plug-in-hybrid-electric vehicles (PHEVs) and fully hybrid-electric vehicles (FHEVs) contain a traction battery assembly to act as an energy source for one or more electric machines. The traction battery includes components and systems to assist in managing vehicle performance and operations. A power inverter is electrically connected between the battery and the electric machines to convert the direct current coming from the battery into alternating current compatible with the electric machines. The power inverter may also act as a rectifier to convert alternating current from the electric machines to direct current compatible with the battery.

SUMMARY

According to one embodiment, a power module assembly for a power inverter of a vehicle includes a housing defining a cavity and a plurality of cards arranged side-by-side in a planar, linear array. The array is positioned within the cavity such that an inlet manifold is defined between a first longitudinal side of the array and the housing and an outlet manifold is defined between a second longitudinal side of the array and the housing. The inlet and outlet manifolds cooperate to form a fluid circuit that is in direct contact with both sides of each of the cards.

According to another embodiment, a power module assembly for a power inverter of a vehicle includes a housing having a tray and a cover connectable to define a cavity, wherein the tray defines a first seat surrounding the cavity, and the cover defines a second seat surrounding the cavity. A plurality of cards each have a first substrate, a second substrate, a plurality of switching units sandwiched between the substrates, and a frame. The frame includes opposing ends each having a first sealing ledge projecting outwardly from the first substrate and a second sealing ledge projecting outwardly from the second substrate. The cards are arranged in a side-by-side planar, linear array that is suspended in the cavity by the first ledges being received in the first seat and the second ledges being received in the second seat such that an inlet manifold is defined between a first longitudinal side of the array and the tray and an outlet manifold is defined between a second longitudinal side of the array and the cover.

According to yet another embodiment, a power module assembly for a power inverter of a vehicle includes a housing having a tray defining a first fluid port and a cover defining a second fluid port. The tray and the cover cooperate to define a cavity in fluid communication with the first and second ports. A plurality of cards each include opposing first and second major sides, a first set of opposing minor sides extending between the major sides, a second set of opposing minor sides extending between the major sides, a frame having a plurality of sealing surfaces each raised from one of the major sides, and compression limiters each extending outwardly from one of the minor sides of the first set. The cards are arranged side-by-side in a linear, planar array with adjacent ones of the second set of opposing minor sides abutting each other. The array is disposed in the cavity with the compression limiters projecting from the cavity and sandwiched between the tray and the cover.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
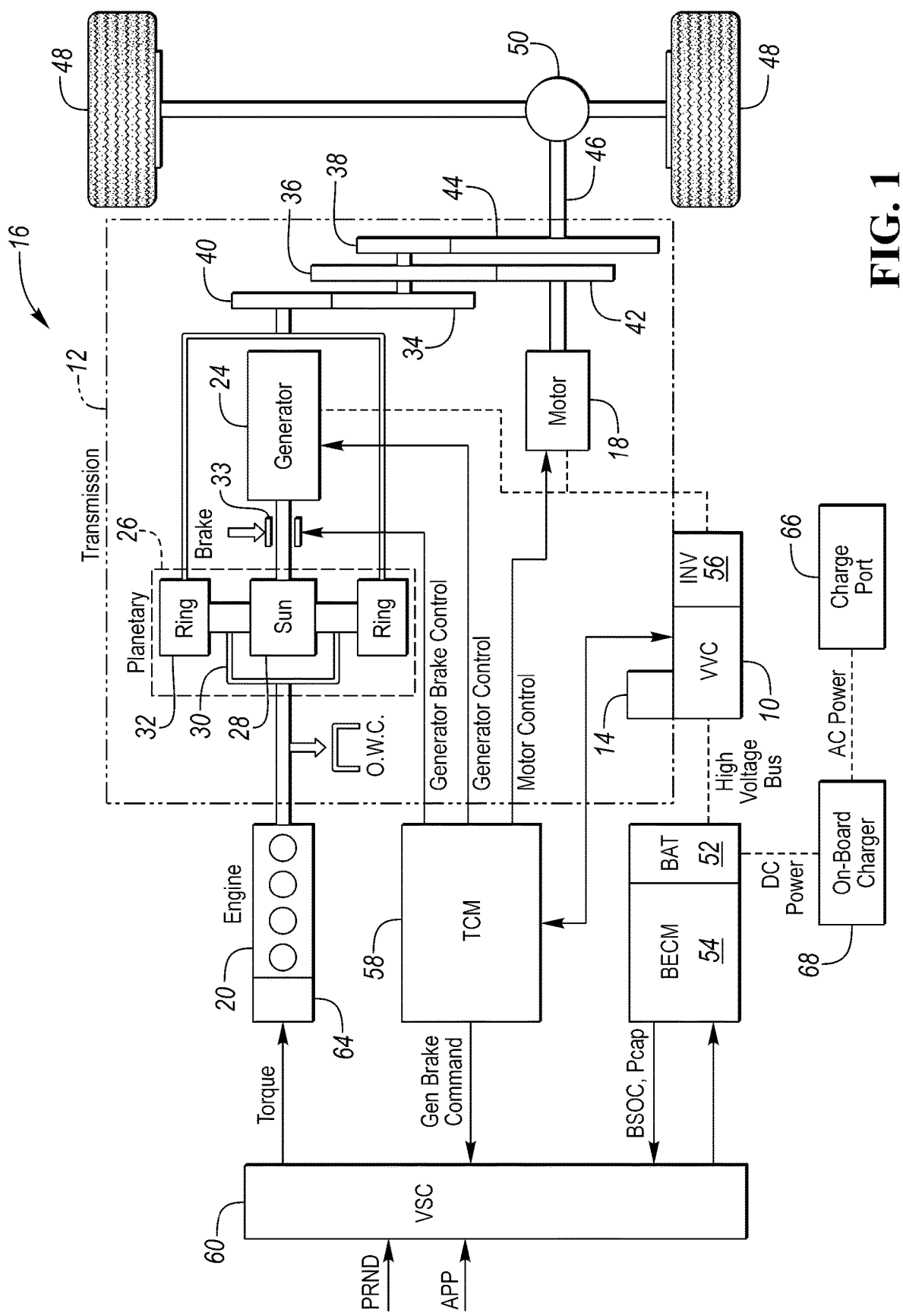
FIG. 1 is a schematic diagram of an example hybrid vehicle.

An example of a PHEV is depicted in FIG. 1 and referred to generally as a vehicle 16. The vehicle 16 includes a transmission 12 and is propelled by at least one electric machine 18 with selective assistance from an internal combustion engine 20. The electric machine 18 may be an alternating current (AC) electric motor depicted as "motor" 18 in FIG. 1. The electric machine 18 receives electrical power and provides torque for vehicle propulsion. The electric machine 18 also functions as a generator for converting mechanical power into electrical power through regenerative braking.

The transmission 12 may be a power-split configuration. The transmission 12 includes the first electric machine 18 and a second electric machine 24. The second electric machine 24 may be an AC electric motor depicted as "generator" 24 in FIG. 1. Like the first electric machine 18, the second electric machine 24 receives electrical power and provides output torque. The second electric machine 24 also functions as a generator for converting mechanical power into electrical power and optimizing power flow through the transmission 12. In other embodiments, the transmission does not have a power-split configuration.

The transmission 12 may include a planetary gear unit 26, which includes a sun gear 28, a planet carrier 30, and a ring gear 32. The sun gear 28 is connected to an output shaft of the second electric machine 24 for receiving generator torque. The planet carrier 30 is connected to an output shaft of the engine 20 for receiving engine torque. The planetary gear unit 26 combines the generator torque and the engine torque and provides a combined output torque about the ring gear 32. The planetary gear unit 26 functions as a continuously variable transmission, without any fixed or "step" ratios.

The transmission 12 may also include a one-way clutch (O.W.C.) and a generator brake 33. The O.W.C. is coupled to the output shaft of the engine 20 to only allow the output shaft to rotate in one direction. The O.W.C. prevents the transmission 12 from back-driving the engine 20. The generator brake 33 is coupled to the output shaft of the second electric machine 24. The generator brake 33 may be activated to "brake" or prevent rotation of the output shaft of the second electric machine 24 and of the sun gear 28. Alternatively, the O.W.C. and the generator brake 33 may be eliminated and replaced by control strategies for the engine 20 and the second electric machine 24.

The transmission 12 may further include a countershaft having intermediate gears including a first gear 34, a second gear 36 and a third gear 38. A planetary output gear 40 is connected to the ring gear 32. The planetary output gear 40 meshes with the first gear 34 for transferring torque between the planetary gear unit 26 and the countershaft. An output gear 42 is connected to an output shaft of the first electric machine 18. The output gear 42 meshes with the second gear 36 for transferring torque between the first electric machine 18 and the countershaft. A transmission output gear 44 is connected to a driveshaft 46. The driveshaft 46 is coupled to a pair of driven wheels 48 through a differential 50. The transmission output gear 44 meshes with the third gear 38 for transferring torque between the transmission 12 and the driven wheels 48.

The vehicle 16 includes an energy storage device, such as a traction battery 52 for storing electrical energy. The battery 52 is a high-voltage battery that is capable of outputting electrical power to operate the first electric machine 18 and the second electric machine 24. The battery 52 also receives electrical power from the first electric machine 18 and the second electric machine 24 when they are operating as generators. The battery 52 is a battery pack made up of several battery modules (not shown), where each battery module contains a plurality of battery cells (not shown). Other embodiments of the vehicle 16 contemplate different types of energy storage devices, such as capacitors and fuel cells (not shown) that supplement or replace the battery 52. A high-voltage bus electrically connects the battery 52 to the first electric machine 18 and to the second electric machine 24.

The vehicle includes a battery energy control module (BECM) 54 for controlling the battery 52. The BECM 54 receives input that is indicative of vehicle conditions and battery conditions, such as battery temperature, voltage and current. The BECM 54 calculates and estimates battery parameters, such as battery state of charge and the battery power capability. The BECM 54 provides output (BSOC, $P_{cap}$) that is indicative of a battery state of charge (BSOC) and a battery power capability ($P_{cap}$) to other vehicle systems and controllers.

The vehicle 16 includes a DC-DC converter or variable voltage converter (VVC) 10 and an inverter 56. The VVC 10 and the inverter 56 are electrically connected between the traction battery 52 and the first electric machine 18, and between the battery 52 and the second electric machine 24. The VVC 10 "boosts" or increases the voltage potential of the electrical power provided by the battery 52. The VVC 10 also "bucks" or decreases the voltage potential of the electrical power provided to the battery 52, according to one or more embodiments. The inverter 56 inverts the DC power supplied by the battery 52 (through the VVC 10) to AC power for operating the electric machines 18, 24. The inverter 56 also rectifies AC power provided by the electric machines 18, 24, to DC for charging the traction battery 52. Other embodiments of the transmission 12 include multiple inverters (not shown), such as one invertor associated with each electric machine 18, 24. The VVC 10 includes an inductor assembly 14.

The transmission 12 includes a transmission control module (TCM) 58 for controlling the electric machines 18, 24, the VVC 10 and the inverter 56. The TCM 58 is configured to monitor, among other things, the position, speed, and power consumption of the electric machines 18, 24. The TCM 58 also monitors electrical parameters (e.g., voltage and current) at various locations within the VVC 10 and the inverter 56. The TCM 58 provides output signals corresponding to this information to other vehicle systems.

The vehicle 16 includes a vehicle system controller (VSC) 60 that communicates with other vehicle systems and controllers for coordinating their function. Although it is shown as a single controller, the VSC 60 may include multiple controllers that may be used to control multiple vehicle systems according to an overall vehicle control logic, or software.

The vehicle controllers, including the VSC 60 and the TCM 58 generally includes any number of microprocessors, ASICs, ICs, memory (e.g., FLASH, ROM, RAM, EPROM and/or EEPROM) and software code to co-act with one another to perform a series of operations. The controllers also include predetermined data, or "look up tables" that are based on calculations and test data and stored within the memory. The VSC 60 communicates with other vehicle systems and controllers (e.g., the BECM 54 and the TCM 58) over one or more wired or wireless vehicle connections using common bus protocols (e.g., CAN and LIN). The VSC 60 receives input (PRND) that represents a current position of the transmission 12 (e.g., park, reverse, neutral or drive). The VSC 60 also receives input (APP) that represents an accelerator pedal position. The VSC 60 provides output that represents a desired wheel torque, desired engine speed, and generator brake command to the TCM 58; and contactor control to the BECM 54.

The vehicle 16 includes an engine control module (ECM) 64 for controlling the engine 20. The VSC 60 provides output (desired engine torque) to the ECM 64 that is based on a number of input signals including APP, and corresponds to a driver's request for vehicle propulsion.

If the vehicle 16 is a PHEV, the battery 52 may periodically receive AC energy from an external power supply or grid, via a charge port 66. The vehicle 16 also includes an on-board charger 68, which receives the AC energy from the charge port 66. The charger 68 is an AC/DC converter which converts the received AC energy into DC energy suitable for charging the battery 52. In turn, the charger 68 supplies the DC energy to the battery 52 during recharging. Although illustrated and described in the context of a PHEV 16, it is understood that the inverter 56 may be implemented on other types of electric vehicles, such as a HEV or a BEV.

Figure 2:
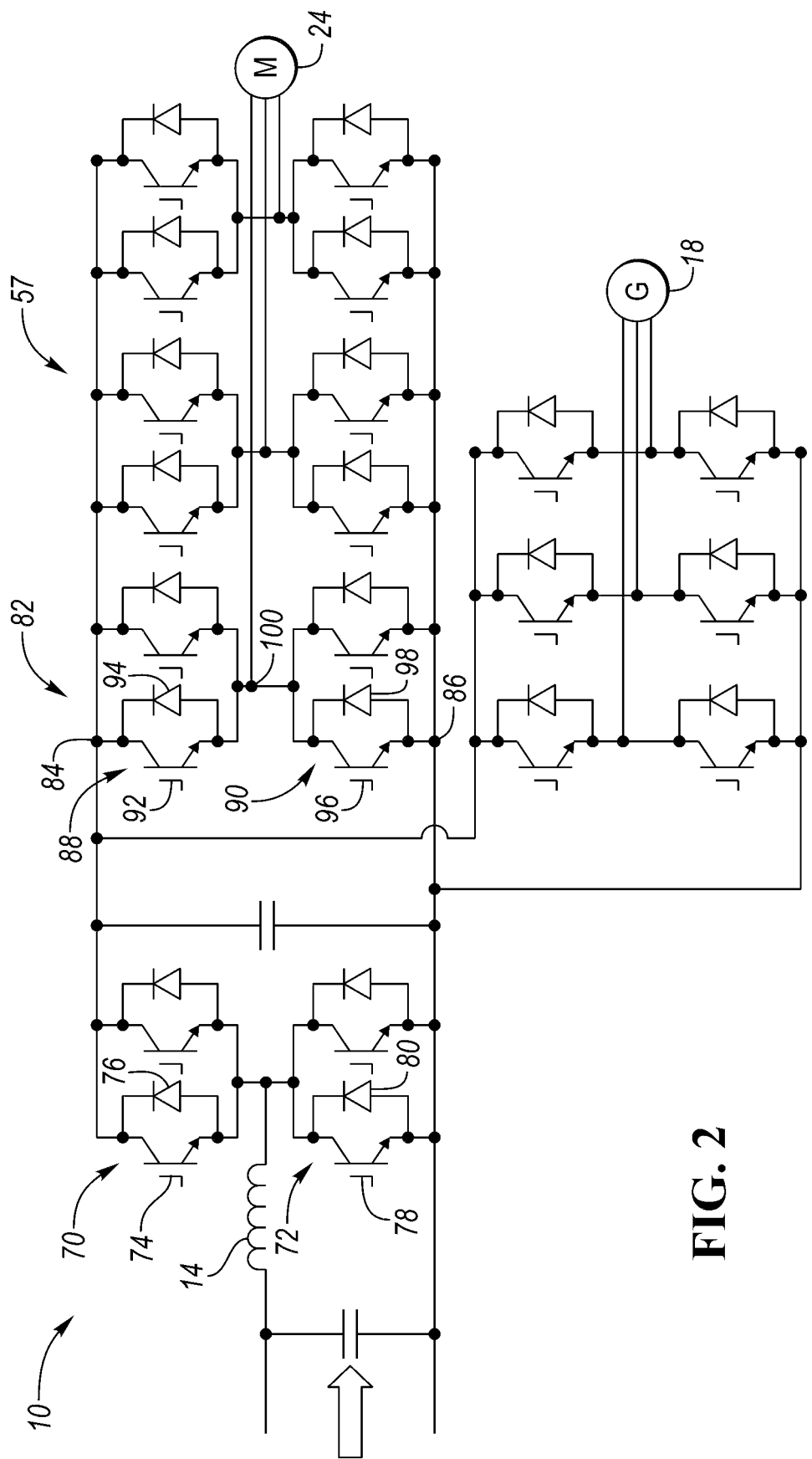
FIG. 2 is a schematic diagram of a variable voltage converter and a power inverter.

Referring to FIG. 2, an electrical schematic of the VVC 10 and the power module assembly 57 of the power inverter 56 is shown. The VVC 10 may include a one or more cards having at least a first switching unit 70 and a second switching unit 72 for boosting the input voltage ($V_{bat}$) to provide output voltage ($V_{dc}$). The first switching unit 70 may include a first transistor 74 connected in parallel to a first diode 76, but with their polarities switched (anti-parallel). In one embodiment the switch 70 may be a reverse conducting insulated gate bipolar transistor (RCIGBT). The second switching unit 72 may include a second transistor 78 connected anti-parallel to a second diode 80. Each transistor 74, 78 may be any type of controllable switch (e.g., an insulated gate bipolar transistor (IGBT) or field-effect transistor (FET)). Additionally, each transistor 74, 78 may be individually controlled by the TCM 58. The inductor assembly 14 is depicted as an input inductor that is connected in series between the traction battery 52 and the switching units 70, 72. The inductor 14 generates magnetic flux when a current is supplied. When the current flowing through the inductor 14 changes, a time-varying magnetic field is created, and a voltage is induced. Other embodiments of the VVC 10 include alternative circuit configurations.

The power module assembly 57 may include a plurality of cards (also known as power modules). Each of the cards may include one or more half bridges 82 having a positive DC lead 84 that is coupled to a positive DC node from the battery and a negative DC lead 86 that is coupled to a negative DC node from the battery. Each of the half bridges 82 may also include a first switching unit 88 and a second switching unit 90. The first switching unit 88 may include a first transistor 92 connected in parallel to a first diode 94. The second switching unit 90 may include a second transistor 96 connected in parallel to a second diode 98. The first and second transistors 88, 96 may be IGBTs or FETs. The first and second switching units 88, 90 may be similar to the switching units 70, 72. The first and second switching units of the each of the half-bridges 82 convert the DC power of the battery into a single phase AC output at the AC lead 100. Each of the AC leads 100 are electrically connected to the motor 18 or generator 24.

The vehicle power inverter may be mounted on a vehicle component, such as a body structure, frame member, or powertrain component. The power inverter may include a power module assembly that is electrically connected with a gate drive board, a capacitor bank, and a control board. The power-module assembly may include a plurality of cards (also known as power modules) each having one or more half bridges packaged therein.

FIGS. 3 to 10 and the related discussion describe example power module assemblies. Referring to FIGS. 3 through 9, an example power module assembly 120 includes a housing 122 that supports a plurality of cards 126 that are liquid cooled within the housing via direct contact between the cards 126 and the coolant. This direct contact increases the thermal efficiency of the system. The coolant is FIGS. 4 and 5 and the associated text describe an example card (or power module) 126 for a power module assembly (such as power module assembly 120). The card 126 may include a first substrate 352 and a second substrate 354 that sandwich a plurality of switching units 356. The first substrate 352 includes an outer panel 358, an inner panel 360, and a dielectric layer 362 disposed between the inner and outer panels. The outer panel 358 defines an outer major side of the card, the inner panel 360 defines an inner major side of the substrate, and the thin edges of the panels and dielectric layer collectively define a portion of the minor sides of the card. The panels and dielectric layer are bonded together by a high-temperature oxidation process for example. The inner and outer panels 358, 360 may be metal such as copper, aluminum, silver, or gold. In one embodiment, the outer panel 358 is unpatterned copper and the inner panel 368 is patterned copper. The term "patterned" refers to a panel that has been etched to define an electrical circuit. The dielectric layer 362 may be ceramic. Example ceramics include alumina, aluminum nitride, and silicon nitride. In some embodiments, the ceramics may be doped. The second substrate 354 also includes an outer panel 364, in inner panel 366, and a dielectric layer 362. The materials of the inner and outer panels and the dielectric layer maybe similar to that described above with respect to the first substrate 352.

Figure 6:
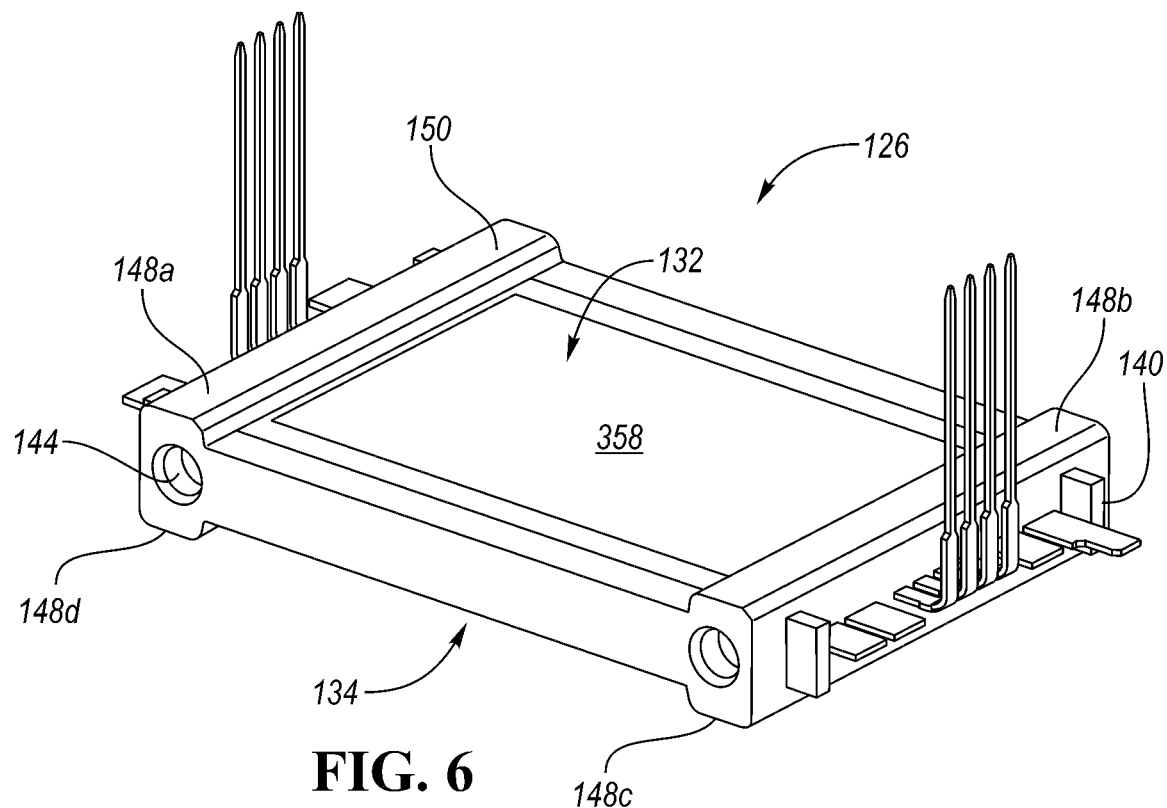
FIG. 6 is a perspective view of the card.

The card 126 includes one or more switching units 356 (also known as chips or dies), such as six switching units shown in the illustrated embodiment of FIG. 6. Each of the switching units 356 includes a transistor 370 and a diode 372. The transistor 370 may be, but is not limited to, IGBTs or FETs. Each of the switching units 356 is electrically connected to one or both of the inner panel 360 and/or the inner panel 366. The card 126 includes a plurality of shims 378 that electrically connect the switching units 356 to one of the inner panels and act as spacing features. A mold compound 380 encapsulates the internal components of the card 126.

Figure 5:
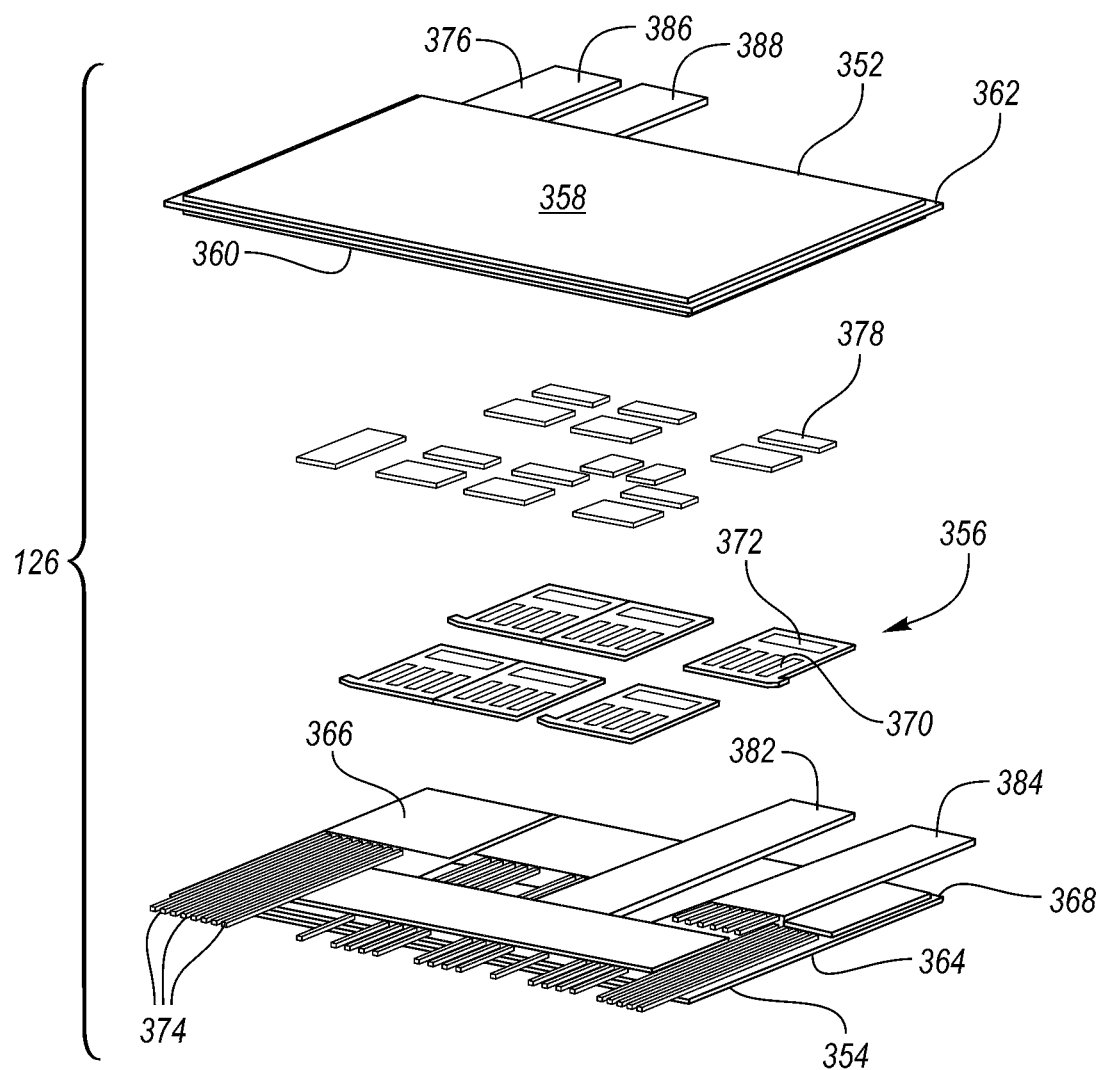
FIG. 5 is an exploded view of the card shown in FIG. 4.

The card 126 also includes a plurality of terminals 376 and signal pins 374. For example, the card 126 may include a positive DC terminal 382, a negative DC terminal 384, a generator AC terminal 386, and a motor AC terminal 388. The DC terminals 382, 384 are electrically connected with the capacitor bank and the traction battery. The AC terminals 386, 388 are electrically connected to an associated electric machine. The signal pins 374 are electrically connected to the gate drive board. The terminals and pins may be formed by a patterned inner panel or may be separate components attached to the switching units 356. The embodiment shown in FIGS. 5 and 6 is merely one example in this application is not limited to any particular card design.

Figure 7:
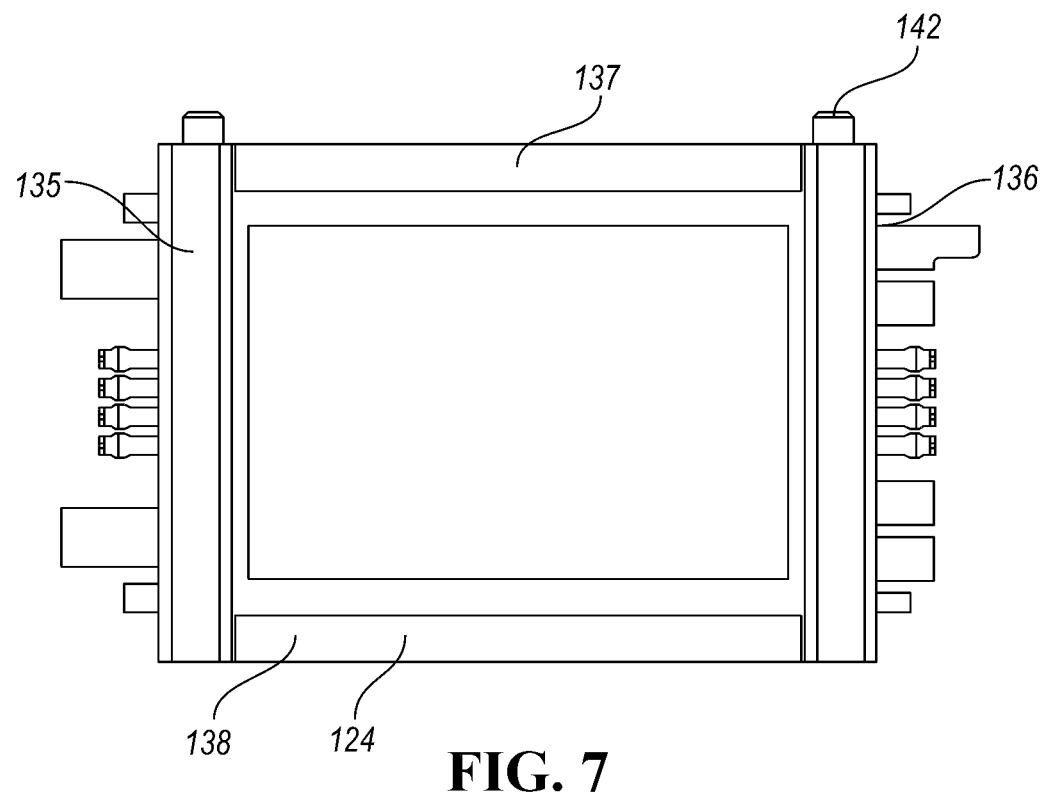
FIG. 7 is top view of the card.

Referring to FIGS. 6 and 7, each card 126 may include an outer frame or border 124, which may be injection molded with the electronic components of the card. Each card 126 may further include a first major side 132 (coinciding with substrate 358), a second major side 134 (coinciding with substrate 364), a first pair of minor sides 135, 136 and second pair of minor sides 137 and 138. The terminals and pins may extend through the frame 124 at the minor sides 135, 136. These minor sides may also include compression limiters 140 that protect the electrical components when the housing is assembled. In the illustrated embodiment, the compression limiters 140 are projections extending outwardly from the minor sides. These projections may be integrally formed with the frame 124.

The cards 126 may include features that are received in adjacent ones of the cards for connection and/or location purposes when the cards are assembled into an array as will be described in more detail below. For example, the minor sides 137 may include one or more projections 142, e.g., pegs, that are sized to be received in one or more receptacles 144, e.g., holes. In the illustrated embodiment, the projections and the receptacles are arranged in pairs to ensure proper orientation of the cards 126 relative to each other when assembled into the array. In some embodiments, these features are for locating purposes and do not include any retaining mechanism. In other embodiments, these features are used to retain the cards to each other, such as via snap fit, click fit, interference fit, or the like.

The frame 124 may be raised on the minor sides 135 and 136 in order to project upwardly (or downwardly) from the major sides 132, 134. That is, the card 126 may have a generally H-shape cross-section when viewed from a side looking at the minor side 138. The raised frame portions may be used for sealing purposes with the housing as will be explained in more detail below. In the illustrated example, the card 126 includes four sealing ledges 148(a-d). The sealing ledges 148a and 148b project outwardly from the major side 132, and the sealing ledges 148a and 148b project outwardly from the major side 134. Each of the sealing ledges 148 may include a sealing surface 150.

Figure 3:
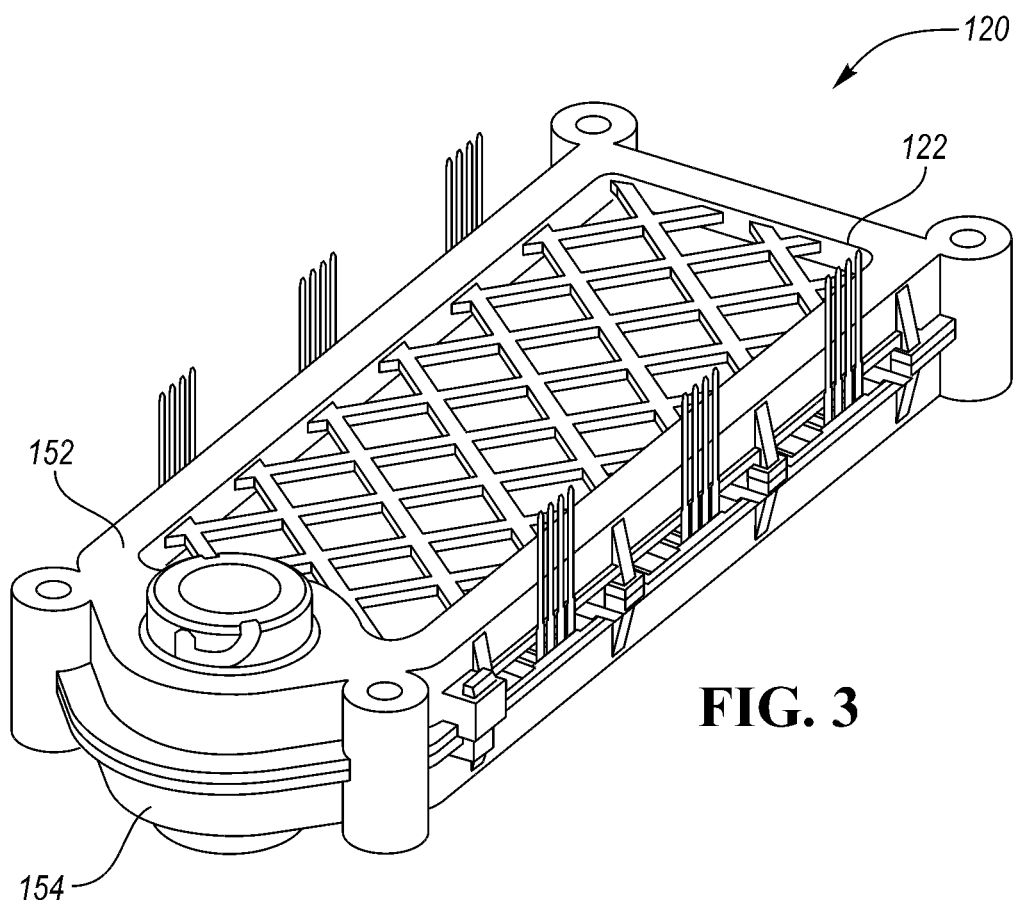
FIG. 3 is a perspective view of a power module assembly of a power inverter.
Figure 4:
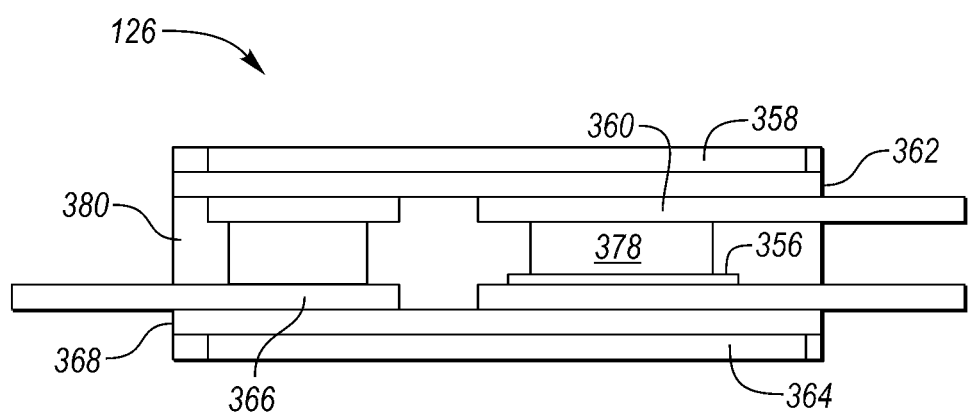
FIG. 4 is a partial side view of an example card.
Figure 8:
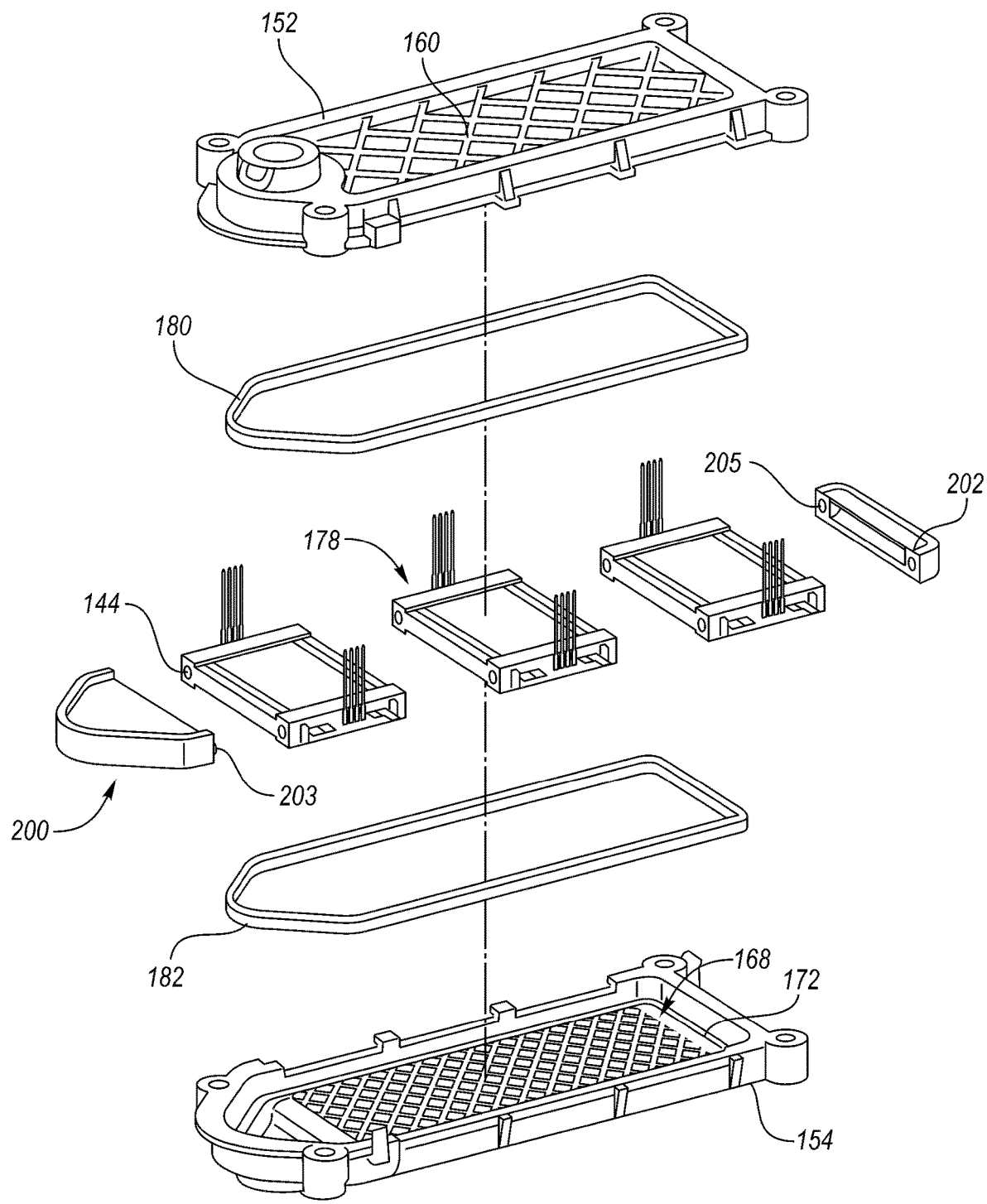
FIG. 8 is an exploded perspective view of the power module assembly.
Figure 9:
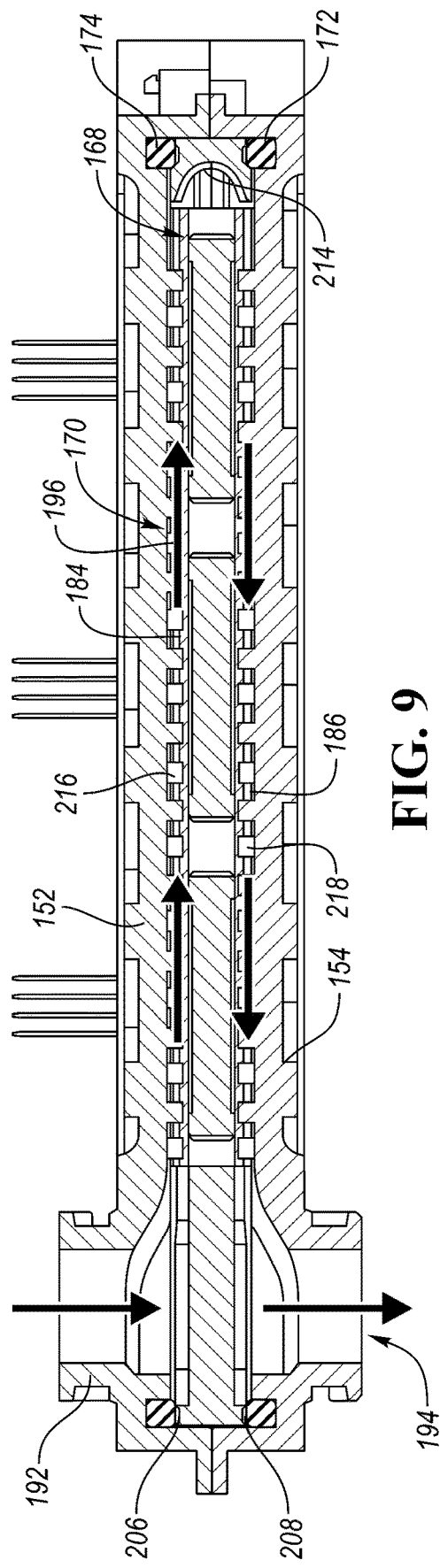
FIG. 9 is a side view, in cross section, of the power module assembly of FIG. 8.

Referring to FIGS. 3, 8, and 9, the housing 122 includes a cover 152 and a tray 154. The terms "tray" and "cover" are for ease of description and do not imply any particular structure nor that the "tray" and "cover" are different nor that the tray is on the bottom and the cover is on top. The tray and cover may be identical halves of the housing (as shown) or may differ in size, shape, etc., in other embodiments. The cover 152 may have a generally elongated shape with a panel 160 (e.g., a top) and sidewalls 162 extending downwardly from the panel 160. The sidewalls 162 and the panel 160 define recessed area. The tray 154 may have a generally elongated shape with a panel 164 (e.g., a bottom) and sidewalls 166 extending upwardly from the panel 164. The sidewalls 166 and the panel 164 define another recessed area. When the housing is assembled, with the cover 152 received on the tray 154, the recessed areas cooperate to define a cavity 168 within the housing 152. The tray 154 may define a first recessed seat 172 surrounding the cavity 168, and the cover 152 may define a second recessed seat 174 surrounding the cavity 168.

The cards 126 may be arranged in a side-by-side planar, linear array 170 that is supported in the cavity 168. The cards 126 are arranged in the array such that the minor sides 137 and 138 abut adjacent minor sides of the next card with the projections 142 received in the receptacles 144. This places the sealing ledges 148 in alignment creating continuous raised rails 178 extending along the longitudinal direction of the array 170. The raised rails define sealing surfaces 179. The array 170 is suspended within the cavity 168 by these raised rails 178. For example, the sealing ledges 148a and 148b are at least partially received in the sealing seat 174 of the cover 152, and the sealing ledges 148c and 148d are at least partially received in the sealing seat 172 of the tray 154. A first seal or gasket 180 is received within the seat 174 and sealingly engages with the sealing ledges 148a and 148b. A second seal or gasket 182 is received within the seat 172 and sealingly engages with the sealing ledges 148c and 148d.

An inlet manifold 184 is defined between a first longitudinal side 188 of the array and the cover 152 and an outlet manifold 186 is defined between a second longitudinal side 190 of the array and the tray 154. The cover 152 may define an inlet port 192 that opens into the inlet manifold 184. The tray 154 may define an outlet port 194 that opens into the outlet manifold. The placement of the inlet/outlet ports may be switched in other embodiments. The manifolds and the ports are in fluid communication and collectively form a fluid path 196 that is in direct contact with the cards 126. Having the liquid coolant in direct contact with the cards 126 reduces the thermal resistance of the cooling system compared to cold plate and cooling fin designs by eliminating the thermal resistance of the cold-plate top or the fins. This creates a more efficient heat transfer between the cards and the coolant compared to traditional designs.

Fluid control components may be attached to the ends of the array 170. For example, a separator 200 may be attached to one end of the array 178 and a return guide 202 may be attached to the other end of the array. The separator 200 may include pins 203 that are received within the receptacles 144 of the first card of the array 178. (Other types of the connections are also contemplated.) The return guide 202 may define receptacles 205 that received the projections 142 of the last card of the array 178. The pins and the receptacles are merely one example of locating and connecting features and others are contemplated as discussed above with regards to the locating and connecting features of the cards.

The separator 200 may be a planar component having a thickness that generally matches the array. For example, the separator may have a main face 204 that is coplanar with the major sides 132, 134 of the cards 126 and raised rims 206/208 that are the same or similar height as the ledges 148. The raised rim 206 may be received in the sealing seat 174 of the cover and engages with the gasket 180. Similarly, the raised rim 208 may is received in the sealing seat 176 of the tray and engages with the gasket 182. The separator 200 is placed between the inlet port 192 and the outlet port 194, which are aligned with each other, e.g., concentric about a common centerline extending through the ports.

The return guide 202 is configured to redirect the coolant from the inlet manifold 172 the outlet manifold 186. The return guide 202 may include raised rims 210, 212 that are received in the sealing seats 174 and 176 and sealingly engage with the gaskets 180 and 182 like the separator. The central portion 214 of the return guide 202 is spaced apart from the minor side 137 of the last card 126 so that fluid can pass through the assembly at that end. The central portion may be curved, e.g., C-shaped, to facilitate the redirecting of coolant.

The upper surface of the main face 204 directs fluid entering through the inlet port 192 to the inlet manifold 170. From there, the fluid path 196 flows across the upper longitudinal side of the array 178 within the inlet manifold 170. The inlet manifold 184 may include a plurality of flow guides 216, which may be an integrally formed portion of the cover 152. The fluid path travels downwardly at the return guide 202 from the inlet manifold 184 to the outlet manifold 186. The outlet manifold 186 may also include flow guides 218. The flow path 196 extends through the outlet manifold 186 in a direction that is opposite to the inlet manifold 184. Coolant then exits the outlet manifold 186 via the outlet port 194. The vehicle may include a coolant circulation system including a pump and one or more heat exchangers for dissipating the heat from the power module assembly 120.

The housing 122 is watertight to prevent coolant from leaking from the power module assembly 120. As discussed above, seals or gaskets 180, 182 are utilized to seal the part line between the tray 154 and the cover 152. Secondary seals or gaskets (not shown) may also be used to assist the main seals. The secondary seals may be inside the main seals, e.g., gaskets 180, 182.

When the housing 122 is fully assembled, the cover 152 is spaced slightly from the tray 154 creating a gap for the pins and terminals of the cards 126 to extend therethrough. This gap is created by the compression limiters 140, which on one side are in contact with the tray 154 and on the other side are in contact with the cover 152.

Figure 10:
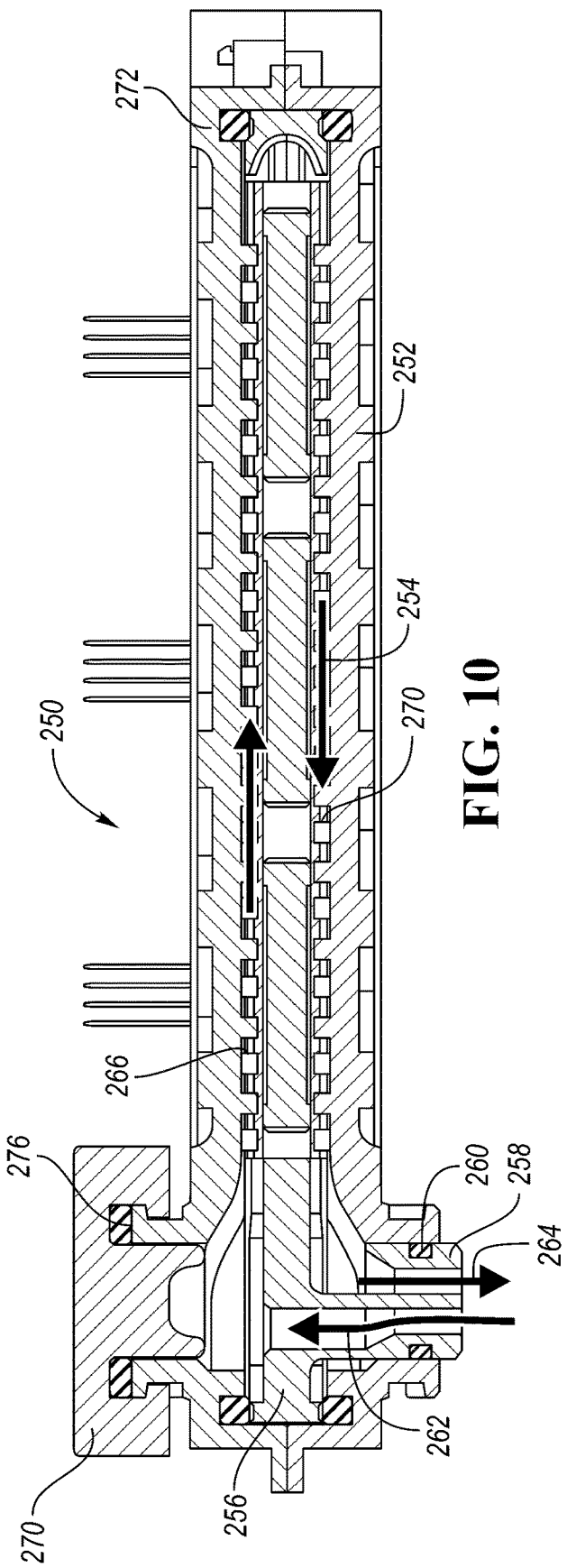
FIG. 10 is a side view, in cross section, of another power module assembly.

FIG. 10 illustrates another power module assembly 250 according to one or more alternative embodiments. Common components will not be discussed again for brevity; please see above for their description. FIG. 10 showcases the modularity of the components of the power module assembly for placement in different vehicles with different packaging constraints. In this embodiment, the tray 252 has both the inlet and the outlet ports for the fluid path 254. In one or more embodiments, the tray 252 is the same component as the above-described tray 154 but the separator 256 is different to create the inlet and outlet ports through the tray. For example, the separator 256 includes a neck 258 that extends through the hole 260 (which was the outlet port 194). The neck 258 defines a pair of channels. One of the channels forms an inlet port 262 and the other of the channels forms an outlet port 264. The inlet channel 262 extends completely through the separator 256 and is in communication with the inlet manifold 266. The outlet channel 264 does not extend completely through the separator so that it is in fluid communication with the outlet manifold 270. The cover 272 may be the same component as the above-described cover 152 and a 274 is used to plug the hole 276 that is not being used in this implementation.

While example embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to strength, durability, life cycle, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications

What is claimed is:

1. A power module assembly for a power inverter of a vehicle, the power module assembly comprising:
    a housing defining a cavity; and
    a plurality of cards arranged side-by-side in a planar, linear array, the array being positioned within the cavity such that an inlet manifold is defined between a first longitudinal side of the array and the housing and an outlet manifold is defined between a second longitudinal side of the array and the housing; wherein
    the inlet and outlet manifolds cooperate to form a fluid circuit that is in direct contact with both sides of each of the cards.

2. The power module assembly of claim 1, wherein the housing defines a channel, and the array defines a sealing surface raised from the first longitudinal side and received in the channel.

3. The power module assembly of claim 2 further comprising a seal disposed in the channel and sealing engaged between the sealing surface of the array and the housing.

4. The power module assembly of claim 2, wherein the housing defines a second channel, and the array defines a second sealing surface raised from the second longitudinal side and received in the second channel.

5. The power module assembly of claim 1, wherein each of the cards is connected to an adjacent one of the cards by locating features.

6. The power module assembly of claim 5, wherein the locating features include a pin and a receptacle.

7. The power module assembly of claim 1, wherein the housing includes a cover and a tray, and wherein each of the cards includes opposing minor sides that each have a compression limiter projecting outwardly therefrom and disposed between the cover and the tray to maintain a gap therebetween.

8. The power module assembly of claim 1, wherein the housing defines an inlet port opening into the inlet manifold and an outlet port opening into the outlet manifold, the inlet and outlet ports being centrically aligned with each other and located on opposing sides of the housing, and further comprising a separator connected to one end of array and disposed between the inlet and outlet ports.

9. The power module assembly of claim 8, wherein the separator is co-planar with the array.

10. The power module assembly of claim 8, wherein one of the separator and the array defines a projection and the other of the separator and the array defines a receptacle that receives the projection.

11. The power module assembly of claim 8 further comprising a return guide connected to the other end of the array opposite the separator and configured to direct fluid from the inlet manifold to the outlet manifold.

12. The power module assembly of claim 1, wherein the housing defines a plurality of flow guides disposed in the inlet and outlet manifolds and projecting towards the array.

13. A power module assembly for a power inverter of a vehicle, the power module assembly comprising:
    a housing including a tray and a cover connectable to define a cavity, wherein the tray defines a first seat surrounding the cavity, and the cover defines a second seat surrounding the cavity; and
    a plurality of cards each having a first substrate, a second substrate, a plurality of switching units sandwiched between the substrates, and a frame, the frame including opposing ends each having a first sealing ledge projecting outwardly from the first substrate and a second sealing ledge projecting outwardly from the second substrate; wherein
    the cards are arranged in a side-by-side planar, linear array that is suspended in the cavity by the first ledges being received in the first seat and the second ledges being received in the second seat such that an inlet manifold is defined between a first longitudinal side of the array and the tray and an outlet manifold is defined between a second longitudinal side of the array and the cover.

14. The power module assembly of claim 13 further comprising:
    a first seal disposed in the first seat and sealingly engaging with the first ledges;
    a second seal disposed in the second seat and sealingly engaging with the second ledges.

15. The power module assembly of claim 13 wherein the tray defines an inlet port opening into the inlet manifold and the cover defines an outlet port opening into the outlet manifold, wherein the ports and manifolds form a fluid path that is in direct contact with the first and second substrates.

16. The power module assembly of claim 15 further comprising a separator connected to one end of array and disposed between the inlet and outlet ports.

17. The power module assembly of claim 16, wherein the separator is co-planar with the array.

18. The power module assembly of claim 13, wherein one of the cards includes a projection that is received in a receptacle defined in another of the cards.

19. A power module assembly for a power inverter of a vehicle, the power module assembly comprising:
- a housing including a tray defining a first fluid port and a cover defining a second fluid port, wherein the tray and the cover cooperate to define a cavity in fluid communication with the first and second ports; and
- a plurality of cards each including:
  - opposing first and second major sides,
  - a first set of opposing minor sides extending between the major sides,
  - a second set of opposing minor sides extending between the major sides,
  - a frame having a plurality of sealing surfaces each raised from one of the major sides, and
  - compression limiters each extending outwardly from one of the minor sides of the first set; wherein
- the cards are arranged side-by-side in a linear, planar array with adjacent ones of the second set of opposing minor sides abutting each other, and
- the array is disposed in the cavity with the compression limiters projecting from the cavity and sandwiched between the tray and the cover.

20. The power module assembly claim 19 further comprising a separator connected to one end of the array and positioned between the first and second fluid ports.

\* \* \* \* \*